United States Patent
Simcoe et al.

(10) Patent No.: US 6,556,329 B1
(45) Date of Patent: Apr. 29, 2003

(54) METHOD AND SYSTEM FOR PREVENTING LOW ORDER OPTICAL TRANSMISSION MODES IN MULTIMODE OPTICAL FIBER COMPUTER NETWORK USING ANNULUS LASER

(75) Inventors: Robert Simcoe, Westborough, MA (US); Bruce A. Schofield, Tyngsboro, MA (US); Jerry D. Hutchison, Littleton, MA (US); Richard L. Kirk, Spencer, MA (US)

(73) Assignee: Enterasys Networks, Inc., Rochester, NH (US)

( * ) Notice: Subject to any disclaimer, the term of this patent is extended or adjusted under 35 U.S.C. 154(b) by 0 days.

(21) Appl. No.: 09/083,062

(22) Filed: May 21, 1998

(51) Int. Cl.[7] .............................................. H04B 10/04
(52) U.S. Cl. ...................................... 359/188; 359/173
(58) Field of Search .......................... 385/15, 31, 38, 385/123; 359/173, 188; 372/103

(56) References Cited

U.S. PATENT DOCUMENTS

| | | | |
|---|---|---|---|
| 4,657,360 A | * 4/1987 | Izukawa et al. | 359/859 |
| 4,723,828 A | 2/1988 | Garel-Jones, et al. | 350/96.15 |
| 5,003,623 A | 3/1991 | Asawa | 455/612 |
| 5,058,123 A | * 10/1991 | Yasui et al. | 372/99 |
| 5,395,356 A | * 3/1995 | King et al. | 606/11 |
| 5,416,862 A | 5/1995 | Haas et al. | 385/28 |
| 5,559,053 A | 9/1996 | Choquette et al. | 437/129 |
| 5,659,568 A | 8/1997 | Wang et al. | 372/96 |
| 5,940,422 A | * 8/1999 | Johnson | 372/45 |
| 6,064,786 A | * 5/2000 | Cunningham et al. | 385/38 |
| 6,075,603 A | * 6/2000 | O'Meara et al. | 356/358 |
| 6,154,589 A | * 11/2000 | Kirk et al. | 385/29 |

FOREIGN PATENT DOCUMENTS

WO    Wo 97 33390 A    12/1997

OTHER PUBLICATIONS

Marcuse, D., "Calculation of bandwidth from index profiles of optical fibers, 1. Theory," *Applied Optics.*, vol. 18, No. 12, 2073–2080 (1979).

Presby, H.M., Marcuse, D., Cohen, L.G., "Calculation of bandwidth from index profiles of optical fibers," *Applied Optics.*, vol. 18, No. 19, 3249–3255 (1979).

Hahn, K.H., et al., "Large Area multitransverse–Mode VCSELS for Modal Noise Reduction in Multimode Fibre Systems" Electronic Letters, vol. 29, No. 16 (1993) p. 1482/1483 XP000654608.

Stryckman, D., et al., "Improvement of the Lateral–Mode Discrimination of Broad–Area Diode Lasers With a Profiled Reflectivity Output Facet" Applied Optics, vol. 35, No. 30 (1996) pp. 5955–5959 XP000630964.

DeBaun, B.A., et al., "Direct VCSEL Launch Into Large Core Multimode Fiber: Enhancement of The Bandwidth Distance Product" Proceedings of the SPIE, The International Society of Optical Engineering, Proceedings of the Conference, Vertical Cavity Surface Emitting Lasers, San Jose, CA USA 13–14 (1997) vol. 3003, pp. 142–152, XP002116048.

\* cited by examiner

*Primary Examiner*—Jason Chan
*Assistant Examiner*—Christina Y Leung
(74) *Attorney, Agent, or Firm*—Wolf, Greenfield & Sacks, P.C.

(57) ABSTRACT

A method for improving modal bandwidth in computer networks using multimode optical fiber and laser sources is disclosed in which an annular beam is generate by the laser source, thus preventing center fiber transmission modes from reaching the detector. This prevents or lessens a pulse-splitting effect at the detector. The annular beam is generated preferably by configuring a vertical cavity surface emitting laser to have a center totally-reflecting block of 5–7 microns to generate a substantially dark-centered beam.

38 Claims, 4 Drawing Sheets

METHOD AND SYSTEM FOR PREVENTING LOW ORDER OPTICAL TRANSMISSION MODES IN MULTIMODE OPTICAL FIBER COMPUTER NETWORK USING ANNULUS LASER

BACKGROUND OF THE INVENTION

Historically, local area computer networks (LANS) using optical data links have relied on light emitting diode (LED) sources launching into multimode optical fibers. The EIA/TIA and IEC Building Wiring Standards (TIA 568A) specified the use of 62.5/125 micron multimode optical fiber for intra-building wiring. These standards have resulted in the large-scale deployment of multimode optical fiber in existing computer networks.

In prior communication application technologies, these data transmission platforms have provided adequate bandwidth. Asynchronous transfer mode (ATM) computer networks can support data transmission rates as high as 622 megabits/sec (MBPS), but LED rise times, the chromatic dispersion associated with the relatively wide bandwidth of light produced by the LEDs, and multiple fiber transmission modes impose an upper cap on the potential data rates. Thus, LED/multimode fiber systems are generally limited to sub-gigabit/second (GBPS) data rates.

Newer computer applications requiring higher bandwidths and the increasing number of users that must be serviced by individual networks have led the push to provide GBPS performance, and better. In order to attain this performance in the context of existing optical data links, the LED light sources have been replaced with laser sources such as vertical cavity surface emitting lasers (VCSEL) and Fabry-Perot lasers. These devices can produce the necessary rise times and have the narrow spectral widths required for GBPS data transmission speeds.

Computer network links modified to use single mode laser sources, however, many times still fail to achieve the data/error rates at GBPS data rates that would be predicted solely from the laser source performance. The problem has been traced to computer links using multimode optical fiber. In many instances, a pulse-splitting phenomena is detected, which increases the bit error rates to unacceptably high levels at these speeds.

The obvious solution to this problem is to use single mode fiber with the single mode sources. While being viable for newly installed computer networks, such a solution is impractical for the installed base of multimode fiber networks since running new fibers in and between buildings represents a significant expense.

Other solutions have been proposed to constrain pulse splitting in signals from single mode sources that have been launched into multimode fibers. In one case, the signal from the single mode source is launched into a short-length pigtail of single mode fiber. The other end of this fiber is then coupled to the existing multimode fiber, offset from the multimode fiber core center.

SUMMARY OF THE INVENTION

The problem with the off-axis, single-mode/multimode fiber coupling solution is the difficulty to implement it in the typical computer network environment. The single mode fiber must be precisely misaligned to the multimode fiber such that the light is still launched into the multimode fiber with acceptable efficiency, and this misalignment must be maintained in the coupling module across its lifetime.

According to the present invention, pulse splitting is constrained in single mode source/multimode fiber systems by preventing light from entering the center of the multimode fiber by controlling the light emission characteristics of the laser source. Specifically, the laser source beam is annularly cross-sectioned. Thus, when properly aligned with the multimode fiber, little or no light is launched down the fiber's center, avoiding the pulse splitting problem.

In specific embodiments, the center region of the annular beam has an optical power density that is reduced by 90% or more with respect to the beam. Further, the beam is preferably completely annular, i.e., forms a complete ring.

In other aspects of the embodiment, the laser source is a vertical cavity surface emitting laser. The annular beam is formed by a totally reflecting center block or stop in the VCSEL's output aperture. The block is dimensioned to form a dark center region of approximately 5 to 7 microns in diameter in the resulting beam.

In general, according to another aspect, the invention features a method for improving modal bandwidth in a computer network. According to the method, a substantially annularly cross-sectioned beam is generated with a laser source. The beam is then coupled into the multimode optical fiber of a computer network for transmission to a detector.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, like reference characters refer to the same parts throughout the different views. The drawings are not necessarily to scale, emphasis instead being placed upon illustrating the principles of the invention. Of the drawings.

DETAILED DESCRIPTION OF THE INVENTION

The modal bandwidth of graded index multimode optical fiber depends directly on the fiber's refractive index profile. The profile is designed to compensate for the different paths traveled by the numerous optical modes supported by the multimode optical fiber. The goal is to equalize delays of all propagating modes.

The propagation time or delay of an optical mode through a fiber is proportional to the optical path length. Low order modes propagate nearly straight through the fiber, traveling a distance close to the fiber's physical length L. Higher order modes travel at higher angles, and the physical distance L traveled is consequently longer. The optical path length of all modes is a product of the distance traveled and the refractive index of the optical medium along their respective paths.

Compensation for the different modal physical distances is achieved by lowering the refractive index of the region of the fiber in which the higher order modes travel.

The index of refraction compensation is performed during the manufacture of the fiber. When the index is graded correctly, modes of different orders will propagate at compensated velocities and arrive at the far end of the fiber at nearly the same times. Research has shown that the optimum grading is obtained with a refractive index profile of the form:

$$n(r) = n1 * [-2 * \Delta n [1 - (r/a)^g]]^{0.5} \text{ for } <a, \text{ and } n(r) = n2 \text{ for } r >= a,$$

where:

n(r) is the refractive index at radial position r, n1 is the refractive index peak value, n2 is the refractive index of the cladding glass, a is the core diameter, $\Delta n$ is the index difference $=(n1^2 - n2^2)/(2 * n1^2)$, and g is the profile parameter, a g=1 gives a straight line curve from 0 to a, g=∞ gives a flat, or step index profile.

A g value of 1.9 to 2.0 has been found to provide optimal propagation delays for multimode optical fibers.

Differential mode delay (DMD) measurements are a method for testing the effectiveness of the index profiling. A fiber is tested by launching a single mode pulse into the core at the core/cladding boundary. The output of the fiber is detected with a high bandwidth detector. The input point is then traversed across a diameter of the fiber while the relative time difference is read and recorded at the other end. The relative delays are plotted against radial position. Fibers with lower DMD profiles, or differences between the delays experienced at the fiber's center relative to near the core/cladding interface, have higher modal bandwidths than those with high DMD profiles.

Figure 1:
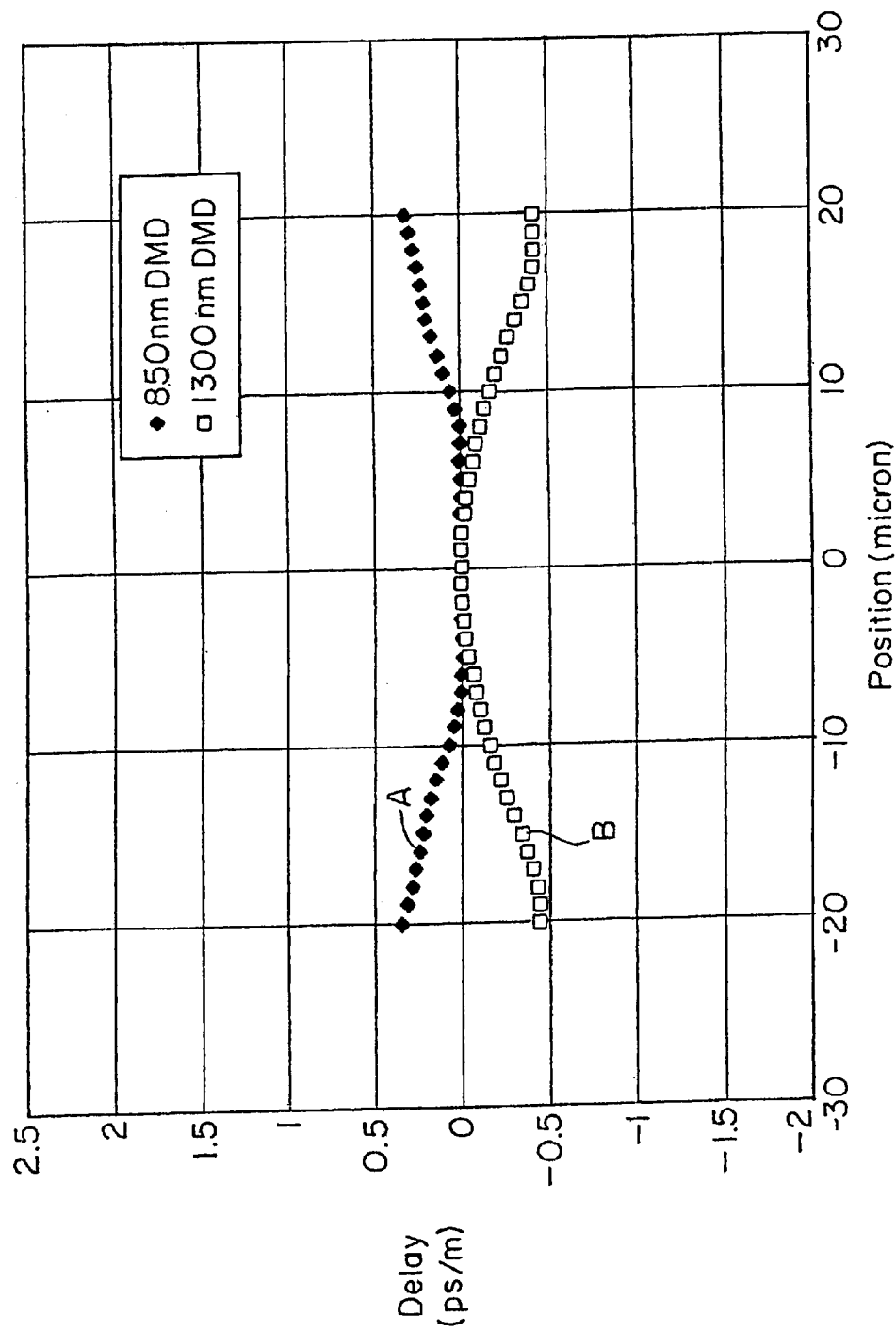
FIGS. 1 and 2 are plots of the differential mode delay in picoseconds per meter as a function of axial launch position for 850 nanometer and 1300 nanometer sources in two exemplary multimode fiber samples.

FIG. 1 is a plot of the DMD for a graded index multimode fiber. Curves A and B show a relatively acceptable DMD for a multimode fiber operating at 850 (see ♦ data points) and 1300 (see ■ data points) nanometers (nm), respectively. In each case, the DMD is less than 0.5 picoseconds per meter (ps/m).

Figure 2:
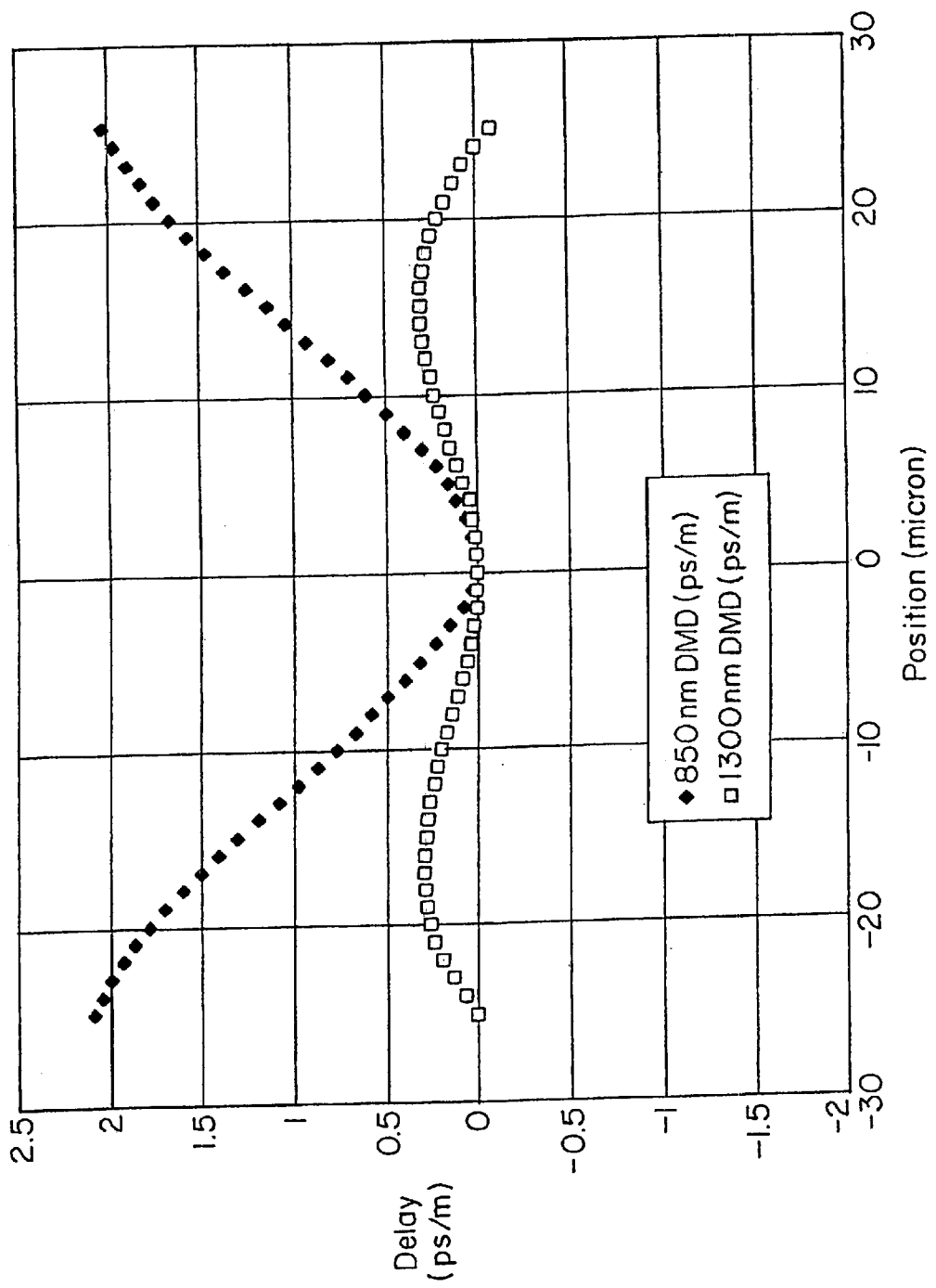

FIG. 2 is a plot of the DMD for another multimode, nominally similar, fiber. The DMD is limited for 1300 nm (■), but at 850 nm (♦), the DMD reaches 2 ps/m for modes launched at a fiber axial position of +/−25 microns from the fiber's center. As a result, when operating at 850 nm, modes transmitted along the fiber's center travel much faster than those near the cladding/core interface.

Figure 3:
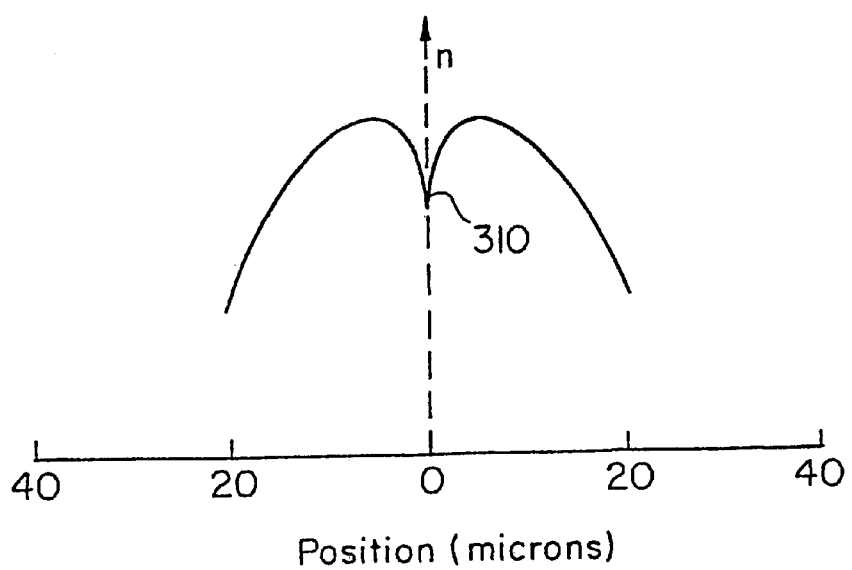
FIG. 3 is a plot of the index of refraction (n) as a function of axial position for an exemplary multimode fiber.

The reduced delay for modes traveling along the fiber's center is theorized to be an artifact of the manufacturing techniques used for the multimode fiber. The fibers are manufactured by slowly depositing closely controlled combinations of chemicals on the inner surface of a hollow glass tube. This process slowly closes the tube off, slowly reducing its inner diameter by the sequential depositions. The last stages, just before the tube is closed-off, can sometimes be incomplete yielding indexes as that illustrated in FIG. 3 when the tube is pulled into the fiber. A sharp anomaly 310 in the graded index (n) occurs near the fiber's center, position 0.

Figure 4:
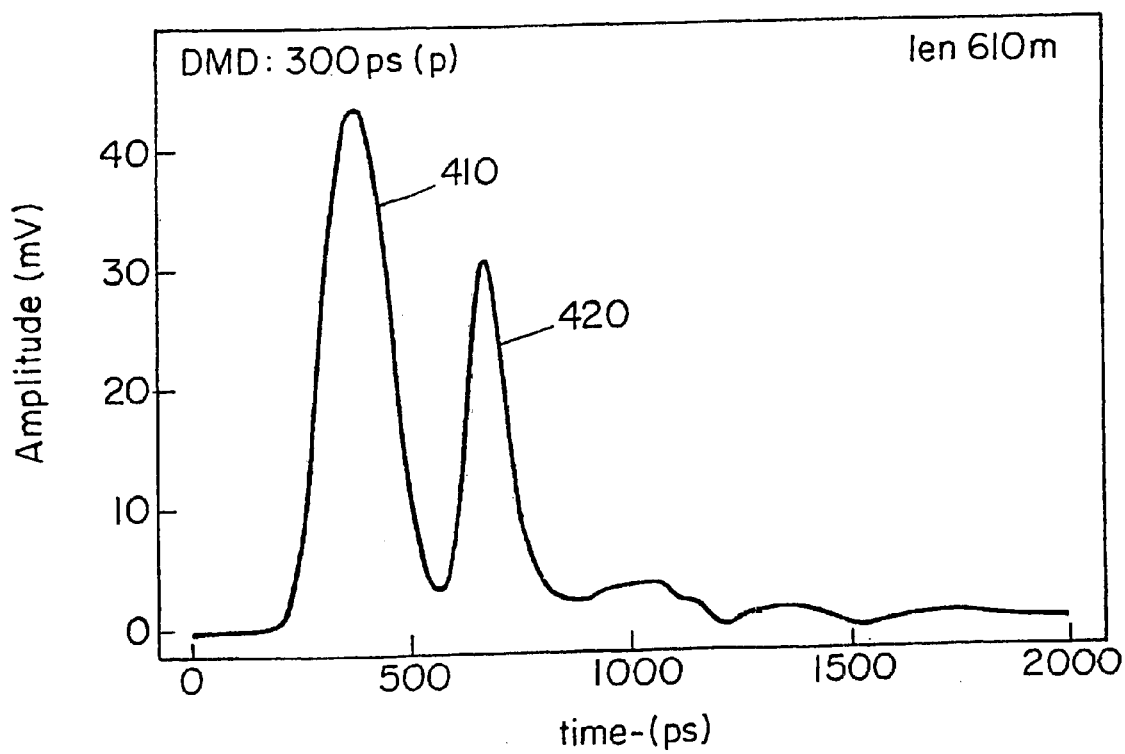
FIG. 4 is a shows a pulse function input signal from a 1300 nm single mode Fabry-Perot laser launched into a 610 meter long, 62.5 micron, fiber run (horizontal scale is 500 ps/division, and the vertical scale is 10 milliVolts/division)

It is theorized that the fiber's center index of refraction anomaly results in pulse splitting such as that shown in FIG. 4, when a single mode laser launches into a multimode fiber. In the experiment, a 1300 nm single mode Fabry-Perot laser launched a pulse function into 610 meter long, 62.5 micron, fiber run. In the plot, the horizontal scale is 500 ps/division, and the vertical scale is 10 milliVolts/division.

After propagating the 610 meters, the original pulse function is converted into an initial pulse 410 and a second pulse 420. This pulse splitting differs from the pulse broadening usually seen when multimode sources are launched into multimode fibers. The highly multimodal and wide bandwidth characteristics of the LED are believed to excite all or most of the fiber's transmission modes. As a result, a relatively small amount of the energy carried by the fiber is transmitted in the fiber's center and thus experiences the problematic transmission delay associated with the center index anomalies. In contrast, it is believed that the single mode laser sources excite a relatively few of the fiber's modes. Some of those modes propagate along the fiber's center, experiencing little delay, and an almost equivalent optical power is contained in other modes that propagate more toward the cladding/core interface, experiencing delay that would be predicted from the graded fiber configuration. These effects result in the distinct splitting, which severely undermines the decision logic in the detector yielding unacceptably high error rates when the transmission speeds approach 1 GBPS. While not all existing multimode fiber has this problem, a non-trivial amount does, and there is no easy test for identifying the problem fibers.

Figure 5:
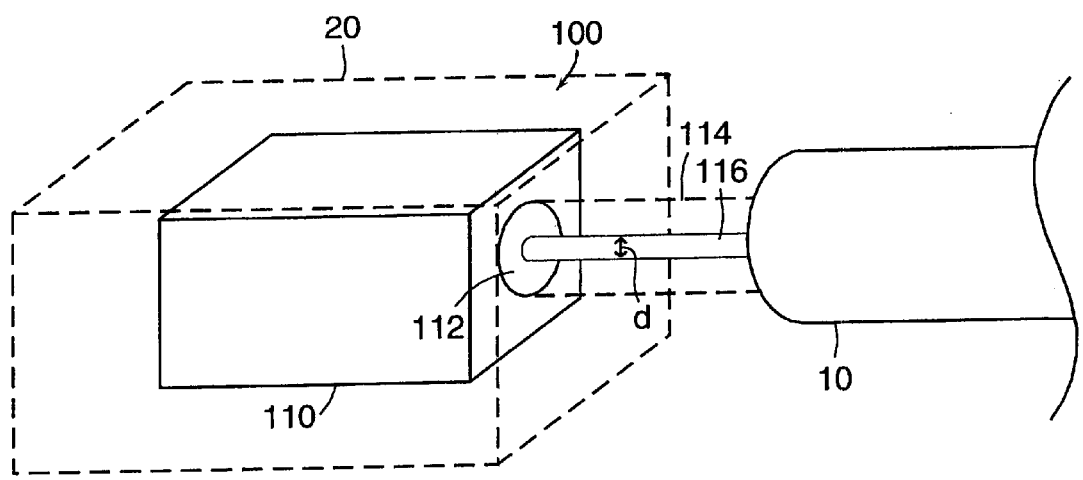
FIG. 5 is a perspective schematic view of an annulus laser system for preventing low order optical transmission modes in a multimode optical fiber computer network.

FIG. 5 illustrates the operation of an annulus laser system constructed according to the principles of the present invention. As is common, a laser device 100 generates a beam 114 that is coupled into a multimode fiber 10 of an optical fiber computer network. In the typical implementation, the laser 100 is housed within a network interface card (NIC) 20 of a personal computer/workstation or other network device.

According to the invention, the laser 100 generates an annularly cross-sectioned beam 114. The beam's center 116 thus carries little or no light. As a result, when the annulus laser 100 is properly coupled to the multimode fiber 10 such that the annular beam 114 is launched into the fiber 10, centered on the fiber, little or no light is consequently conveyed down the fiber's center. The beam's dark center 116 eclipses the fiber's center with its potentially anomalous transmission characteristics.

Experiments have shown that stopping the center, low order transmission modes of the fiber 10 from being excited by the laser 100 prevents pulse splitting effect at the detector. The limited cross-coupling between the fiber's modes ensures that little or no center modes will be present at the fiber's other end, at the detector, when the center modes are not initially excited. As a result, the center modes, which may propagate too quickly due to reduced center index of refraction present in some multimode fibers, will not contribute to a pulse splitting effect at the detector, thereby preserving modal bandwidth for the computer network of the fiber 10.

Figure 6:
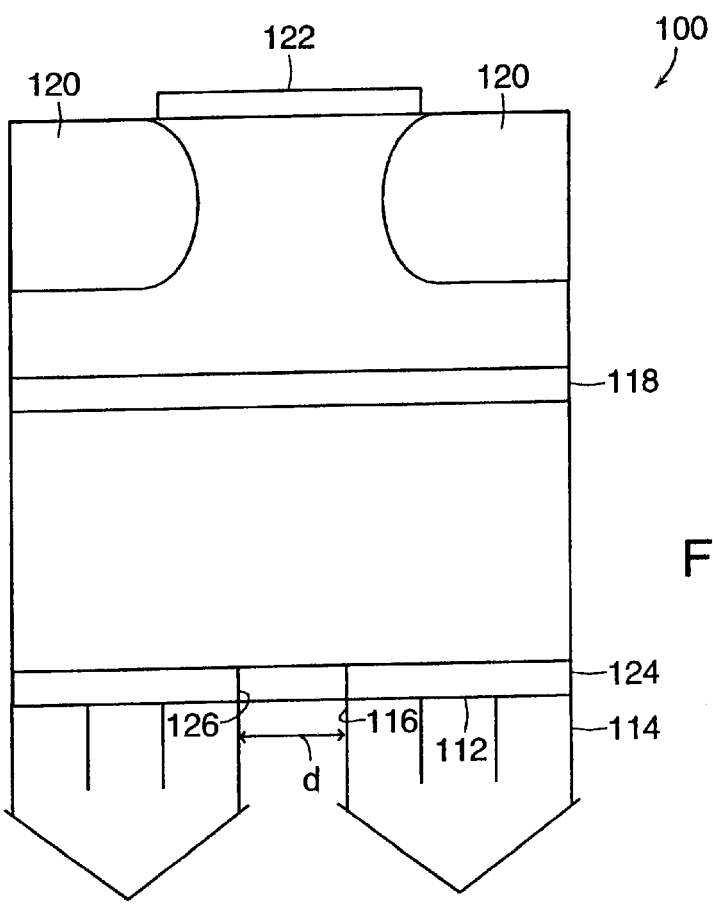
FIG. 6 is a cross-sectional view showing an exemplary VCSEL laser device for generating the annular beam.

FIG. 6 is a cross-sectional view of an exemplary VCSEL laser device 100 that will generate the annular beam 114 according to the invention. Specifically, as is common in these VCSEL devices, the resonant cavity of the device is defined by a total reflecting mirror 122, which also functions as an electrode, and a partially reflecting output aperture mirror 112. This output aperture can commonly be constructed from a dielectric layer 124 using photolithography processes. As is also common in this class of device, light is generated in an active layer 118 when current flows from or to the electrode 122 and is confined by non-conductive implanted regions 120.

According to the invention, the partially reflecting dielectric mirror layer 124 on the laser's output aperture 112 has a center beam block or stop 126 that prevents light from exiting the laser along its center axis. In the preferred embodiment, this center block is a totally reflecting region. In other embodiments, it may be opaque, but this can contribute to excessive output aperture heating at high power levels. In either case, the generated beam 114 will have a dark center 116, caused by the center block 126.

The center block 126 is preferably large enough to create a 5 to 7 micron diameter (d) center dark region 116 in the beam 114. In highly collimated systems, this corresponds to a center block 126 of an approximately equal 5 to 7 micron diameter.

Other laser devices may be substituted for the VCSEL. Generally, the VCSEL is chosen because of its wide beam generation corresponds closely to the relatively large transmission aperture of multimode fiber. Systems based on distributed feedback lasers, Fabry-Perot lasers, and other external cavity lasers could also be used. Devices generating large cross-section beams, however, are less common in such devices, thus making it more difficult to create a large enough center dark section to avoid exciting center transmission modes of the fiber while still maintaining adequate launch power into the fiber 10.

There are a number advantages of the present system relative to the off-axis launch approach. Most importantly, the annular beam excites a larger portion of the fiber's transmission modes, and thus allows higher power optical pulses. This facilitates data transmission over longer fiber links at acceptable data error rates without repeaters. In contrast, the off-axis approach excites a relatively small number of the fiber's modes in a very narrow region of the fiber's area. Moreover, the alignment is more straight-forward in the present invention since the laser device is directly aligned to the fiber 10. There is no need for controlled misalignment.

Of course the beam does not need to be annular. It can be substantially annular with breaks in the ring cross-section. Generally, this should be minimized, however, in order to maximize the light coupled into the fiber. Moreover, the center of the annular beam should be as dark as possible. Strictly, however, it does not need to be absolutely dark, since the objective is simply to minimize the pulse splitting effect at the detector so as not to confuse its decision logic. As a result, a center portion preferably has 10% or less of the optical power density than the lighted portions of the annular beam.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A system for improving modal bandwidth in a network using a multimode optical fiber transmission media, comprising:

a laser device, comprising an exit aperture, wherein the exit aperture forms one end of a resonant cavity enclosing the laser device, the exit aperture comprising a center block adapted for blocking emission of a portion of a generated laser beam, wherein the center block causes the beam to have a substantially annularly cross-sectioned profile with a substantially dark center region; and a multimode optical fiber of the network for transmitting the beam.

2. A system as described in claim 1, wherein the center region of the annular beam has an optical power density that is 10% or less than the beam.

3. A system as described in claim 1, wherein the annular beam is completely annular in cross-section.

4. A system as described in claim 1, wherein the laser device is a vertical cavity surface emitting laser.

5. A system as described in claim 1, wherein the center block is a totally reflecting portion in an otherwise partially reflecting exit aperture of the laser.

6. A system as described in claim 1, wherein the center region is between approximately 5 to 7 microns in diameter.

7. A system as described in claim 1, wherein the laser beam and the multimode optical fiber are substantially co-axially positioned.

8. A system as described in claim 1, wherein the center block and the multimode optical fiber are substantially co-axially positioned.

9. A system as described in claim 1, wherein all of the laser beam, the center block and the multimode optical fiber are substantially co-axially positioned.

10. A system as described in claim 1, wherein the laser beam is a wide beam having a cross-sectional area corresponding closely to a cross-sectional area of the multimode optical fiber.

11. A system as described in claim 1, wherein the laser beam has an effective cross-sectional diameter of at least one half of the cross-sectional diameter of a core of the multimode optical fiber.

12. A system as described in claim 1, wherein the center block has a diameter of up to 7 microns.

13. A system as described in claim 1, wherein the dark center region has a cross-sectional area smaller than a cross-sectional area of the annularly cross-sectioned profile which is unblocked.

14. A method for improving modal bandwidth in a network having a multimode optical fiber transmission media, comprising:

generating a laser beam with a laser source, said laser source comprising an exit aperture that forms one end of a resonant cavity enclosing the laser device;

blocking emission of a portion of the generated laser beam with the exit aperture comprising a center block, centered substantially at a center of the exit aperture causing the laser beam to have a substantially annularly cross-sectioned profile and a substantially dark center region; and coupling the laser beam into the multimode optical fiber of the network for transmission to a detector such that the dark center region of the laser beam covers a portion of the fiber's cross-sectional area, including a central optical axis of the fiber.

15. A method as described in claim 14, further comprising generating the beam with a substantially dark center region.

16. A method as described in claim 14, further comprising generating the beam with a dark center region that has an optical power density that is 10% or less than the beam.

17. A method as described in claim 14, further comprising generating the beam with a completely annular cross-section.

18. A method as described in claim 14, further comprising generating the beam with a vertical cavity surface emitting laser.

19. A method as described in claim 18, further comprising providing the vertical cavity surface emitting laser with an exit aperture that has a block.

20. A method as described in claim 19, wherein the block is a totally reflecting portion in an otherwise partially reflecting end of the laser.

21. A method as described in claim 14, further comprising generating the beam with a dark center region of between approximately 5 to 7 microns in diameter.

22. A method as described in claim 14, further comprising substantially aligning the laser beam and the multimode optical fiber co-axially.

23. A method as described in claim 14, further comprising substantially aligning the center block and the multimode fiber.

24. A method as described in claim 14, further comprising substantially aligning all of the laser beam, the center block, and the multimode optical fiber.

25. A method as described in claim 14, wherein generating a laser beam comprises generating a wide beam having a cross-sectional area corresponding closely to a cross-sectional area of the multimode optical fiber.

26. A method as described in claim 14, wherein the laser beam has an effective cross-sectional diameter of at least one half of the cross-sectional diameter of the multimode optical fiber's core.

27. A method as described in claim 14, wherein the center block has a diameter of up to 7 microns.

28. A method as described in claim 14, wherein the dark center region has a cross-sectional area smaller than a cross-sectional area of the annularly cross-sectioned profile which is unblocked.

29. A laser device, comprising:
a laser source that provides a laser beam;
an exit aperture of the laser source, through which the laser beam is provided externally to the laser source to provide a laser output signal; and
a multimode optical fiber that receives the output signal;
wherein the exit aperture includes an annularly-shaped non-blocking portion through which laser light may pass, and a blocking center portion within said annularly-shaped non-blocking portion of the exit aperture, said blocking portion being substantially centered at a center of said exit aperture, such that the laser device output signal has an annular pattern and a dark center region within the annular pattern.

30. The device as claimed in claim 29, wherein the blocking center portion of the exit aperture causes the dark center region to have an optical power density that is 10% or less than that of the annular pattern.

31. The device as claimed in claim 29, wherein the laser source comprises a vertical cavity surface emitting laser.

32. The device as claimed in claim 29, wherein the blocking center portion comprises a reflecting portion.

33. The device as claimed in claim 29, wherein the blocking center portion has a diameter between approximately 5 to 7 microns.

34. The device as claimed in claim 29, wherein the multimode optical fiber and the exit aperture are substantially co-axially positioned.

35. The device as claimed in claim 29, wherein the blocking center portion and the multimode optical fiber are substantially co-axially positioned.

36. The device as claimed in claim 29, wherein all of the laser source, the center blocking portion and the multimode optical fiber are substantially co-axially positioned.

37. The device as claimed in claim 29, wherein the laser beam has a cross-sectional area corresponding closely to a cross-sectional area of the multimode optical fiber.

38. The device as claimed in claim 29, wherein the laser beam has an effective cross-sectional diameter of at least one-half of the cross-sectional diameter of a core of the multimode optical fiber.

* * * * *